(12) United States Patent
Kim et al.

(10) Patent No.: US 10,418,348 B2
(45) Date of Patent: Sep. 17, 2019

(54) LIGHT EMITTING DIODE PACKAGE AND LIGHT EMITTING DIODE MODULE

(71) Applicant: Seoul Semiconductor Co., Ltd., Ansan-si (KR)

(72) Inventors: Myung Jin Kim, Ansan-si (KR); Kwang Yong Oh, Ansan-si (KR); Seung Ryeol Ryu, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 53 days.

(21) Appl. No.: 15/708,792

(22) Filed: Sep. 19, 2017

(65) Prior Publication Data

US 2018/0082985 A1 Mar. 22, 2018

(30) Foreign Application Priority Data

Sep. 21, 2016 (KR) .................. 10-2016-0120765

(51) Int. Cl.
*H01L 25/075* (2006.01)
*H01L 25/13* (2006.01)
*H01L 33/50* (2010.01)
*H01L 33/48* (2010.01)

(52) U.S. Cl.
CPC .......... *H01L 25/0753* (2013.01); *H01L 25/13* (2013.01); *H01L 33/502* (2013.01); *H01L 33/507* (2013.01); *H01L 33/483* (2013.01)

(58) Field of Classification Search
CPC .................. H01L 25/0753; H01L 33/502
See application file for complete search history.

(56) References Cited

U.S. PATENT DOCUMENTS

| | | | |
|---|---|---|---|
| 2009/0096370 A1* | 4/2009 | Murazaki | C09K 11/0883 313/504 |
| 2013/0119415 A1* | 5/2013 | Wu | H01L 25/0753 257/89 |
| 2015/0318452 A1* | 11/2015 | Wu | H01L 25/0753 257/89 |
| 2016/0062023 A1* | 3/2016 | Itoh | G02B 6/0068 362/608 |
| 2016/0276549 A1* | 9/2016 | Yamashita | H05B 37/02 |
| 2017/0336677 A1* | 11/2017 | Ajichi | H01L 33/00 |
| 2018/0069161 A1* | 3/2018 | Kawaguchi | H01L 33/62 |
| 2018/0082985 A1* | 3/2018 | Kim | H01L 25/0753 |
| 2018/0219147 A1* | 8/2018 | Ogata | F21V 29/502 |
| 2018/0374830 A1* | 12/2018 | Zhang | H01L 25/0753 |

* cited by examiner

*Primary Examiner* — John P. Dulka
(74) *Attorney, Agent, or Firm* — H.C. Park & Associates, PLC (57) ABSTRACT

A light emitting diode package including a housing, a first light emitting diode chip and a second light emitting diode chip disposed in the housing, and a wavelength conversion part including a phosphor configured to absorb light emitted from the first light emitting diode chip and emit light having a different wavelength than the light emitted from the first light emitting diode chip, in which the light emitted from the first light emitting diode chip has a shorter wavelength than light emitted from the second light emitting diode chip, and the phosphor has a fluorescence intensity of 10 or less at a peak wavelength of light emitted from the second light emitting diode chip, with reference to a maximum fluorescence intensity of 100 at a wavelength of 425 nm to 475 nm on an excitation spectrum of the second light emitting diode chip.

20 Claims, 4 Drawing Sheets

LIGHT EMITTING DIODE PACKAGE AND LIGHT EMITTING DIODE MODULE

CROSS-REFERENCE TO RELATED APPLICATION

This patent document claims priority to and the benefit of Korean Patent Application No. 10-2016-0120765, filed on Sep. 21, 2016, which is incorporated by reference for all purposes as if fully set forth herein.

BACKGROUND

Field

Exemplary embodiments relate to a light emitting diode package and a light emitting diode module, and more particularly, to a light emitting diode package that improves luminous efficacy of a light emitting diode chip, and a light emitting diode module.

Discussion of the Background

A light emitting diode (LED) refers to a compound semiconductor device that has a p-n junction of semiconductors and emits light through recombination of a small number of carriers (electrons and holes). A light emitting diode generally has low power consumption, long lifespan, and a small size.

Generally, a light emitting diode is provided as a chip, and a light emitting diode package is provided to package a light emitting diode chip. The light emitting diode package may include phosphors as wavelength conversion elements to realize white light. Specifically, the phosphors are disposed on the light emitting diode chip, such that white light can be realized through mixing one or more primary light emitted from light emitting diode chip and secondary light subjected to wavelength conversion through the phosphors.

A conventional light emitting diode package may realize white light by using phosphors (yellow phosphors), which may emit yellow white through excitation of light received from a blue light emitting diode chip. However, the light emitting diode package using the yellow phosphors alone emits light lacking a red color component, and thus, has characteristics of low color index and high color temperature. In order to solve such problems, some light emitting diode packages may employ a mixture of phosphors emitting green light (hereinafter, green phosphors) or phosphors emitting yellow light (hereinafter, yellow phosphors), and phosphors emitting red light (hereinafter, red phosphors) in a wavelength conversion part rather than using one type of yellow phosphor.

However, when a structure includes phosphors having different peak wavelengths mixed in the wavelength conversion part, luminous efficacy of the light emitting diode package may be significantly deteriorated.

Therefore, there is a need for fundamental improvement of energy conversion efficiency by phosphors for a light emitting diode package.

SUMMARY

Exemplary embodiments provide a light emitting diode package that improves wavelength conversion efficiency by preventing energy loss caused by wavelength conversion while realizing white light, and a light emitting diode module including the same.

Exemplary embodiments also provide a light emitting diode package that broadens a color gamut, and a light emitting diode module including the same.

Exemplary embodiments further provide a white light emitting diode package that prevents light loss arising from a high density of phosphors, and a white light emitting diode module including the same.

Exemplary embodiments also provide a light emitting diode package that improves resolution and light output to reduce power consumption, and a light emitting diode module including the same.

In accordance with one aspect of the present disclosure, a light emitting diode package includes a housing, a first light emitting diode chip and a second light emitting diode chip disposed in the housing, and a wavelength conversion part including a phosphor absorbing light emitted from the first light emitting diode chip and emitting light having a different wavelength than the light emitted from the first light emitting diode chip, in which the light emitted from the first light emitting diode chip emits light has a shorter wavelength than light emitted from the second light emitting diode chip, and the phosphor has a fluorescence intensity of 10 or less at a peak wavelength of light emitted from the second light emitting diode chip, with reference to a maximum fluorescence intensity of 100 at a wavelength of 425 nm to 475 nm on an excitation spectrum of the second light emitting diode chip.

The first light emitting diode chip and the second light emitting diode chip may emit blue light and green light, respectively.

The first light emitting diode chip may emit blue light, the second light emitting diode chip may emit green light, and the wavelength conversion part may emit red light.

The blue light may have a peak wavelength of 440 nm to 460 nm and the green light may have a peak wavelength of 515 nm to 530 nm.

The phosphor may include at least one of nitride phosphor, sulfide phosphor, fluoride phosphor, quantum dot phosphor, and combinations thereof.

The phosphor may include fluorine-based phosphor and the phosphor may have a fluorescence intensity of 5 or less at the peak wavelength of the light emitted from the second light emitting diode chip, with reference to the maximum fluorescence intensity of 100 on the excitation spectrum thereof.

The phosphor may be a quantum dot phosphor and comprises at least one compound semiconductor of In, Zn, S, Cd, Se, Pb, and combinations thereof.

Red light emitted from the wavelength conversion part may exhibit at least three peaks at a wavelength of 600 nm to 660 nm.

The light emitting diode package may emit white light by mixing light emitted from the first light emitting diode chip, the second light emitting diode chip, and the wavelength conversion part.

The light emitting diode package may have a color gamut of 95% or more with reference to an NTSC (National Television System Committee)

In accordance with another aspect of the present disclosure, a light emitting diode package includes a housing having a first cavity and a second cavity a first light emitting diode chip disposed in the first cavity, a second light emitting diode chip disposed in the second cavity, and a wavelength conversion part disposed in the first cavity and converting wavelengths of light emitted from the first light emitting diode chip, in which light emitted from the first light emitting diode chip emits light has a shorter wavelength than light emitted from the second light emitting diode chip, and the light emitted from the second light emitting diode chip is blocked from entering the wavelength conversion part.

The wavelength conversion part may further include a first transparent resin including phosphors dispersed therein, and the second cavity may include a second transparent resin not including phosphors.

In accordance with a further aspect of the present disclosure, a light emitting diode module includes a substrate and the light emitting diode package mounted on the substrate.

According to exemplary embodiments, the light emitting diode packages can improve wavelength conversion efficiency through reduction of energy interference between phosphors.

In addition, according to the exemplary embodiments, the light emitting diode packages emit white light using light emitting diode chips configured to emit light having different wavelengths and thus can reduce the density of phosphors within the wavelength conversion part, thereby improving the color gamut while reducing light loss through reduction in non-luminous absorption by the phosphors.

BRIEF DESCRIPTION OF THE DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Exemplary embodiments of the present disclosure will be described in more detail with reference to the accompanying drawings. However, it should be understood that the present disclosure is not limited to the following embodiments and may be embodied in different ways. Rather, the following embodiments are given by way of illustration only to provide thorough understanding of the present disclosure to those skilled in the art.

It should be understood that, when a layer is referred to as being "on" another layer or substrate, it can be directly formed on the other layer or substrate, or intervening layer(s) may also be present. In addition, spatially relative terms, such as "above," "upper (portion)," "upper surface," and the like may be understood as meaning "below," "lower (portion)," "lower surface," and the like according to a reference orientation. In other words, spatial orientations are to be construed as indicating relative orientations instead of absolute orientations.

Like elements are denoted by like reference numerals throughout the specification and drawings. In addition, it should be understood that the terms "comprise," "include," and/or "have(has)" as used herein, specify the presence of stated features, numerals, steps, operations, elements, and/or components, but do not preclude the presence or addition of one or more other features, numerals, steps, operations, elements, and/or components.

Hereinafter, exemplary embodiments of the present disclosure will be described in detail with reference to the accompanying drawings.

Figure 1:
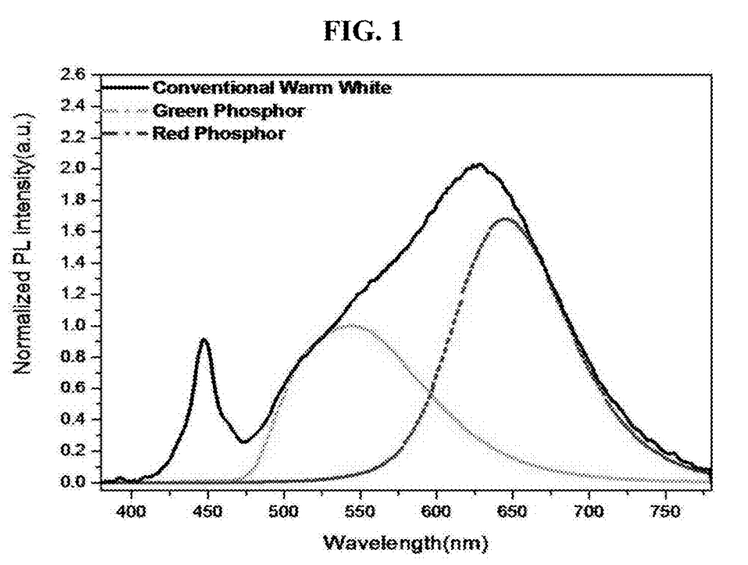
FIG. 1 is a graph depicting luminous spectrum distributions of a green phosphor and a red phosphor and a luminous spectrum distribution of a white LED.
Figure 2:
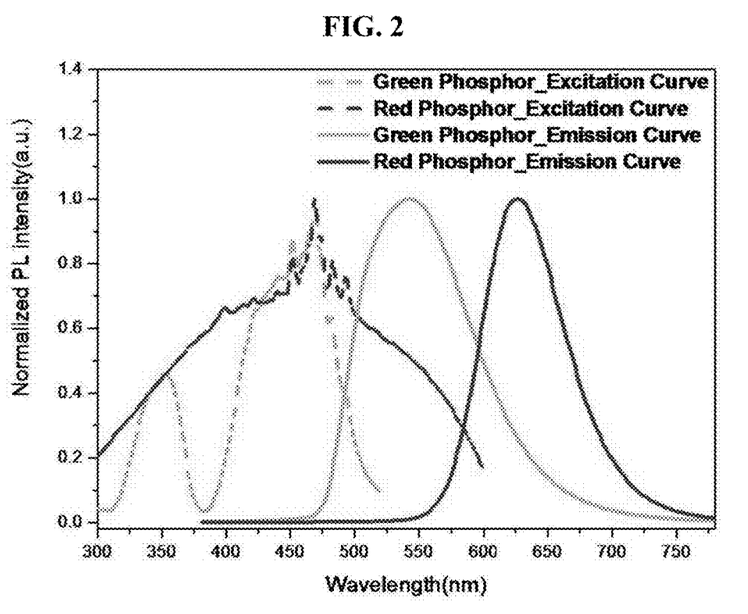
FIG. 2 is a graph depicting excitation spectrum distributions and luminous spectrum distributions of a green phosphor and a red phosphor.

FIG. 1 is a graph depicting luminous spectrum distributions of a green phosphor and a red phosphor and a luminous spectrum distribution of a white LED. FIG. 2 is a graph depicting excitation spectrum distributions and luminous spectrum distributions of a green phosphor and a red phosphor.

Referring to FIG. 1, a peak wavelength of green light is placed near 540 nm and a peak wavelength of red light is placed near 650 nm. In order to realize white light, a conventional white light emitting diode package includes a blue light emitting diode chip and a wavelength conversion part, which may include green and red phosphors that are mixed together and emit green light and red light through excitation of light received from the blue light emitting diode chip. When the green phosphors and the red phosphors are mixed, some fractions of green light emitted from the green phosphors may excite the red phosphors.

Accordingly, in the white light emitting diode package, light emitted from the blue light emitting diode chip is absorbed by the green phosphors and the red phosphors, which in turn emit light depending upon the wavelengths thereof, and some fractions of light emitted from the green phosphors are absorbed by the red phosphors, which in turn emit red light. Accordingly, energy conversion efficiency of the phosphors may be reduced.

Referring to FIG. 2, the excitation spectrum distribution of the red phosphor substantially overlaps the excitation spectrum distribution of the green phosphor. More particularly, the red phosphor absorbs light emitted from the blue light emitting diode chip and light emitted from the green phosphor, which may cause energy interference between the green phosphor and the red phosphor. In addition, since phosphors generally have a broad absorption wavelength band, green light emitted from the green phosphor may be absorbed again by the green phosphor.

Accordingly, the overall energy conversion efficiency is reduced due to conversion efficiency of blue light by the green phosphors, conversion efficiency of blue light by the red phosphors, absorption of green light by the green phosphors, and conversion efficiency of green light by the red phosphors. Moreover, since two or more types of phosphors are mixed in one wavelength conversion part, the wavelength conversion part may have a high density of the phosphors, which may cause light loss through non-luminous absorption by the phosphors.

Figure 3:
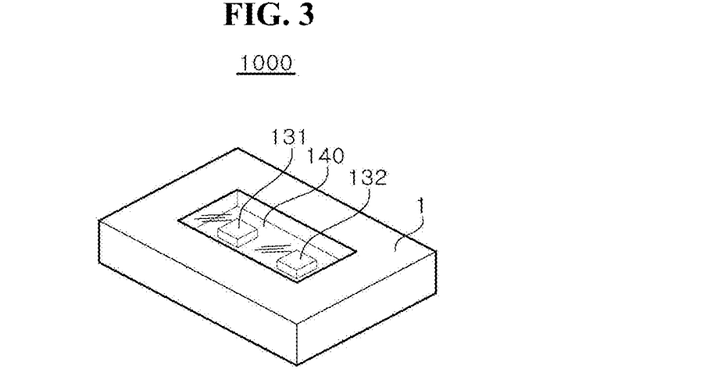
FIG. 3 and FIG. 4 are perspective views of a light emitting diode package according to exemplary embodiments.

FIG. 3 is a schematic perspective view of a light emitting diode package according to an exemplary embodiment.

Referring to FIG. 3, a light emitting diode package 1000 may include a housing 1, a first light emitting diode chip 131, a second light emitting diode chip 132, and a wavelength conversion part 140 including phosphors 150.

The housing 1 may include a cavity to which the first light emitting diode chip 131 and the second light emitting diode chip 132 are received. The housing 1 may be formed of various materials including metal, ceramic, or general plastic (polymer) materials, for example, acrylonitrile butadiene styrene (ABS), liquid crystalline polymers (LCP), polyamides (PA), polyphenylene sulfide (IPS), thermoplastic elastomers (TPE), epoxy molding compounds (EMC), or silicone molding compounds (SMC), without being limited thereto.

The first light emitting diode chip 131 and the second light emitting diode chip 132 may be received in the cavity of the housing 1, and may emit blue light and green light, respectively. For example, the first light emitting diode chip 131 may emit light having a shorter wavelength than the second light emitting diode chip 132. For the light emitting diode package 1000 to realize white light using one wavelength conversion part 140, the first light emitting diode chip 131 may emit blue light having a peak wavelength of 440 nm to 460 nm and the second light emitting diode chip 132 may emit green light having a peak wavelength of 515 nm to 530 nm.

The first light emitting diode chip 131 and the second light emitting diode chip 132 may include, for example, gallium nitride semiconductors. The light emitting diode package 1000 shown in FIG. 3 is illustrated as including two light emitting diode chips 131 and 132 received in the cavity. However, the inventive concepts are not limited thereto, and the number and arrangement of first and second light emitting diode chips 131 and 132 may be varied.

The wavelength conversion part 140 may include phosphors 151 that convert wavelengths of light emitted from the first light emitting diode chip 131. The phosphors 151 may have a fluorescence intensity of 10 or less at a peak wavelength of light emitted from the second light emitting diode chip 132, with reference to a maximum fluorescence intensity of 100 of the excitation spectrum of light emitted from the second light emitting diode chip 132.

Specifically, the wavelength conversion part 140 includes the phosphors 151, which may absorb blue light emitted from the first light emitting diode chip 131 and emit red light having a peak wavelength of 580 nm to 700 nm. The phosphors 151 may include at least one of nitride phosphors, sulfide phosphors, fluoride phosphors, quantum dot phosphors, and combinations thereof, without being limited thereto. For example, the phosphors 151 may include fluorine-based phosphors.

Quantum dot phosphors (QDs: quantum dot) may be a compound semiconductor including particles having a size of 2 nm to 50 nm, also referred to as nanocrystals. The quantum dot phosphors may include at least one of Group II to XVI ions, and may include binary, ternary, and quaternary materials. That is, the quantum dot phosphors may include materials containing two, three, and four different ions. For example, the quantum dot phosphors may include at least one of In, Zn, S, Cd, Se, and Pb. For example, the quantum dot phosphors may include at least one of Group II-VI or III-V compound semiconductors including CdS, CdSe, CdTe, ZnS, ZnSe, ZnTe, HgS, HgSe, HgTe, GaN, GaP, GaAs, AN, AlP, AlAs, InN, InP, and InAs, mixtures thereof, and composites thereof, in which the composite may include at least one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, SnS, CuInS, CuZnS, CuSnS, CuSnSe, CuSnGaS, and CuSnGaSe, without being limited thereto.

As such, the light emitting diode package 1000 according to an exemplary embodiment may emit white light through mixing light emitted from the first light emitting diode chip 131, which emits blue light having a peak wavelength of 440 nm to 460 nm, the second light emitting diode chip 132, which emits green light having a peak wavelength of 515 nm to 530 nm, and the wavelength conversion part 140, which emits red light having a peak wavelength of 580 nm to 700 nm and includes one type of phosphors 151 to prevent interference between different types of phosphors. In this manner, energy conversion efficiency of light emitted from the light emitting diode chips may be improved.

On the excitation spectrum, the fluorescence intensity at a wavelength of 630 nm and the degree of light absorption by the phosphors at each wavelength may be exhibited upon irradiating the phosphors with light, while changing the wavelengths of light under the same energy condition. That is, the phosphors 151 emitting red light through absorption of blue light emitted from the first light emitting diode chip 131 are substantially prevented from absorbing green light emitted from the second light emitting diode chip 132, thereby reducing light loss through reduction in non-luminous absorption by the phosphors 151.

Figure 4:
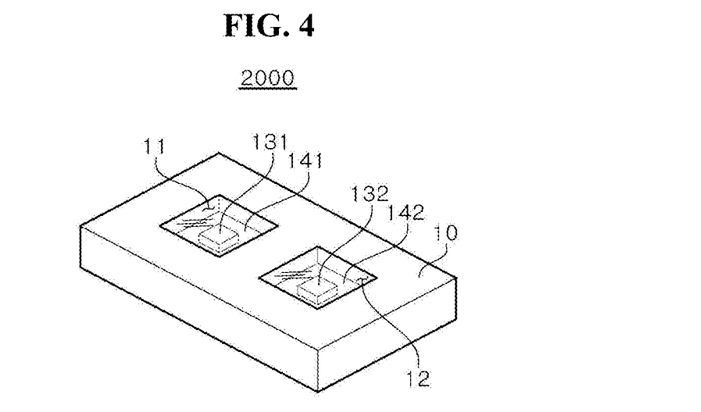

FIG. 4 is a schematic perspective view of a light emitting diode package according to an exemplary embodiment.

Referring to FIG. 4, a light emitting diode package 2000 includes a housing 10 having a first cavity 11 and a second cavity 12, a first light emitting diode chip 131, a second light emitting diode chip 132, and a wavelength conversion part 141.

The housing 10, the first light emitting diode chip 131, and the second light emitting diode chip 132 of the light emitting diode package 2000 may be substantially similar to those in the light emitting diode package 1000 shown in FIG. 3. The light emitting diode package 2000 of FIG. 4, however, is distinguished from the light emitting diode package 1000 of FIG. 3, in that the housing 10 has regions divided from each other by the first cavity 11 and the second cavity 12, such that the first light emitting diode chip 131 and the second light emitting diode chip 132 may be received in the first cavity 11 and the second cavity 12, respectively.

Specifically, the housing 10 may be divided into the first cavity 11 and the second cavity 12, such that light emitted from the second light emitting diode chip 132 is blocked from entering the wavelength conversion part 141. Thus, when the wavelength conversion part 141 including phosphors 152 is disposed in the first cavity 11 or the second cavity 12, the light emitting diode package 2000 may essentially prevent non-luminous absorption by the phosphors 152. The structure of the light emitting diode package 2000 will be described in more detail.

The wavelength conversion part 141 may include the phosphors 152 disposed in the first cavity 11 to convert wavelengths of light emitted from the first light emitting diode chip 131. Specifically, the wavelength conversion part 141 includes the phosphors 152, which can absorb blue light emitted from the first light emitting diode chip 131 to emit red light having a peak wavelength of 580 nm to 700 nm. The phosphors 152 may include at least one of nitride phosphors, sulfide phosphors, fluoride phosphors, quantum dot phosphors, and combinations thereof. The phosphors 152 in the light emitting diode package 2000 may be the same or different from the phosphors 151 in the light emitting diode package 1000 described with reference to FIG. 3.

In addition, the wavelength conversion part 141 may further include a transparent resin, in which the phosphors 152 are dispersed. The transparent resin may include at least one of silicone, epoxy, poly(methyl methacrylate) (PMMA), polyethylene (PE), and polystyrene (PS) resins, without being limited thereto.

The second cavity 12 may or may not include a wavelength conversion part including phosphors, depending upon a color of light to be emitted from the light emitting diode package 2000. For example, in the light emitting diode package 2000 emitting white light, the first light emitting diode chip 131 emitting blue light and the wavelength conversion part 141 including the phosphors 152 emitting red light through absorption and wavelength conversion of the blue light may be disposed in the first cavity 11. Further, the second light emitting diode chip 132 emitting green light may be disposed in the second cavity 12 of the light emitting diode package 2000, on which a transparent resin containing no phosphors is disposed to form a molding portion 142.

More particularly, in the light emitting diode package 2000 of FIG. 4, the phosphors 152 emitting red light through absorption and excitation of blue light are disposed in the first cavity 11, and the transparent resin not containing the phosphors 152 is disposed in the second cavity 12, in which the second light emitting diode chip 132 emitting green light is disposed. In this manner, the light emitting diode package 2000 according to an exemplary embodiment may prevent interference between different kinds of phosphors, which may occur in a conventional structure using a mixture of red light phosphors and green light phosphors, and may prevent energy loss from reabsorption of light emitted from the green light phosphors into the red light phosphors.

Figure 5:
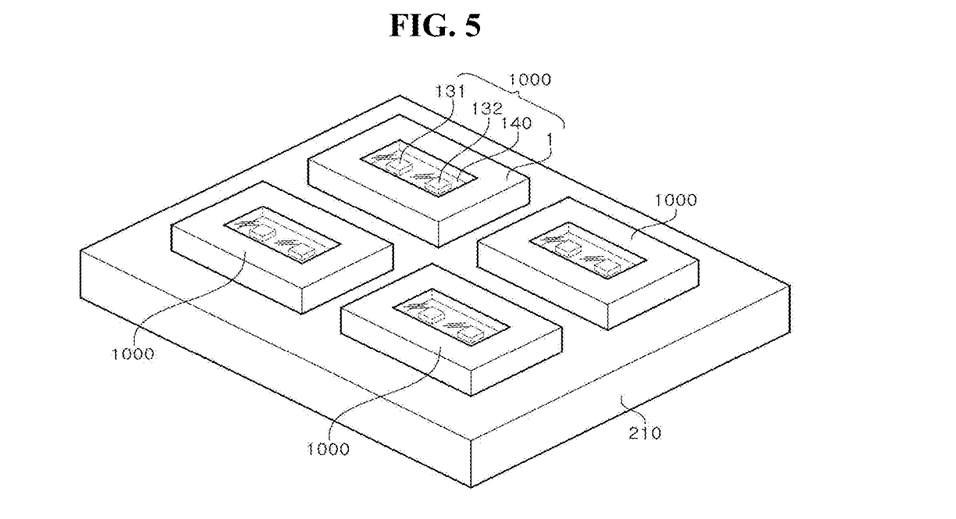
FIG. 5 and FIG. 6 are perspective views of a light emitting diode module according to exemplary embodiments.
Figure 6:
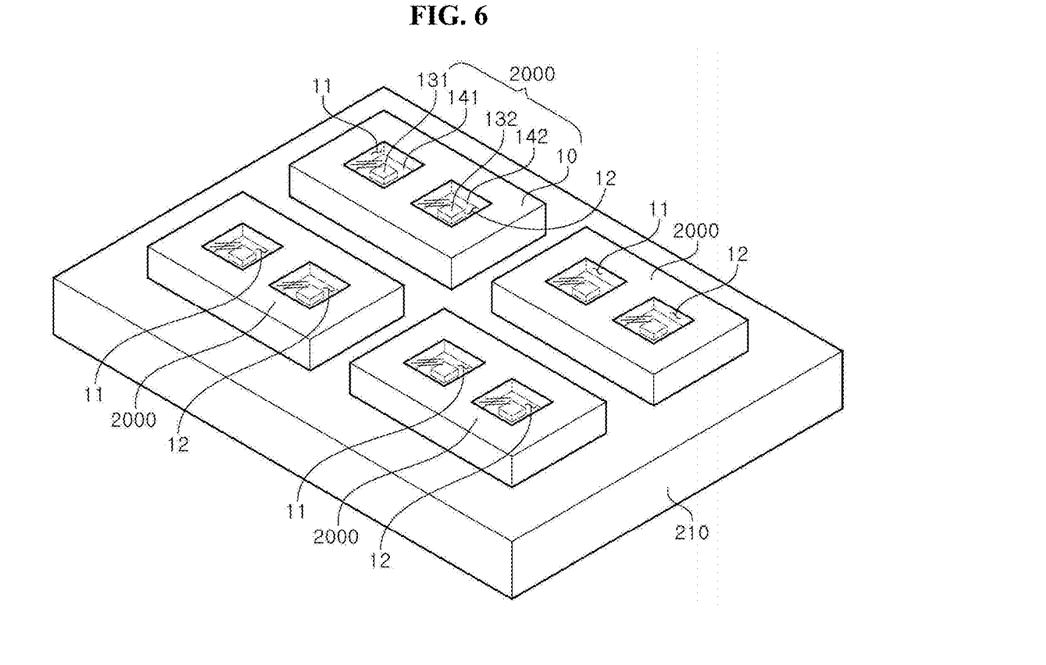

FIG. 5 and FIG. 6 are perspective views of a light emitting diode module according to an exemplary embodiment.

Referring to FIG. 5 and FIG. 6, the light emitting diode module according to an exemplary embodiment includes a substrate 210 and the light emitting diode packages 1000 or 2000 according to the exemplary embodiments mounted on the substrate 210.

The substrate 210 is not particularly limited, and may be formed of various materials in consideration of dissipation of the light emitting diode packages 1000 or 2000 and electrical connection thereof. For example, a printed circuit board may be used as the substrate 210.

For example, the light emitting diode module according to the present exemplary embodiment may emit white light by mixing light emitted from the first light emitting diode chip 131 emitting blue light having a peak wavelength of 440 nm to 460 nm, the second light emitting diode chip 132 emitting green light having a peak wavelength of 515 nm to 530 nm, and the wavelength conversion part 140 emitting red light having a peak wavelength of 580 nm to 700 nm.

It should be noted that although realization of white light is mainly illustrated in the above exemplary embodiments, the inventive concepts are not limited white light and may be applied to various light emitting diode packages or light emitting diode modules, which may emit mixed light using at least two types of phosphors having different peak wavelengths.

Experimental Example 1

Example 1 is the light emitting diode package 1000 manufactured according to an exemplary embodiment. Referring back to FIG. 3, the light emitting diode package 1000 includes a housing 1, which receives a blue light emitting diode chip emitting blue light having a peak wavelength of about 450 nm and a green light emitting diode chip emitting green light having a peak wavelength of about 525 nm therein, and a wavelength conversion part 140 disposed in the cavity and including phosphors that emit red light through absorption and excitation of blue light. In addition, a portion of the wavelength conversion part 140 molding the cavity may include phosphors, such as YAG, LuAG, ortho-silicate, thiogallate, oxynitride, or Beta-SiAlON-based phosphors.

Figure 7:
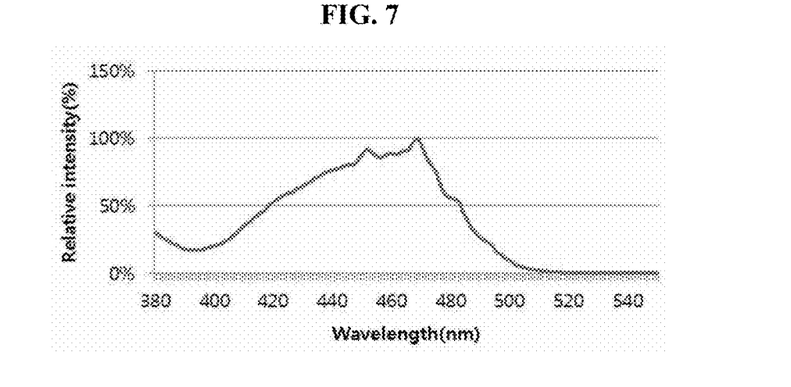
FIG. 7 is a graph depicting an excitation spectrum of a red phosphor emitting red light according to an exemplary embodiment.
Figure 8:
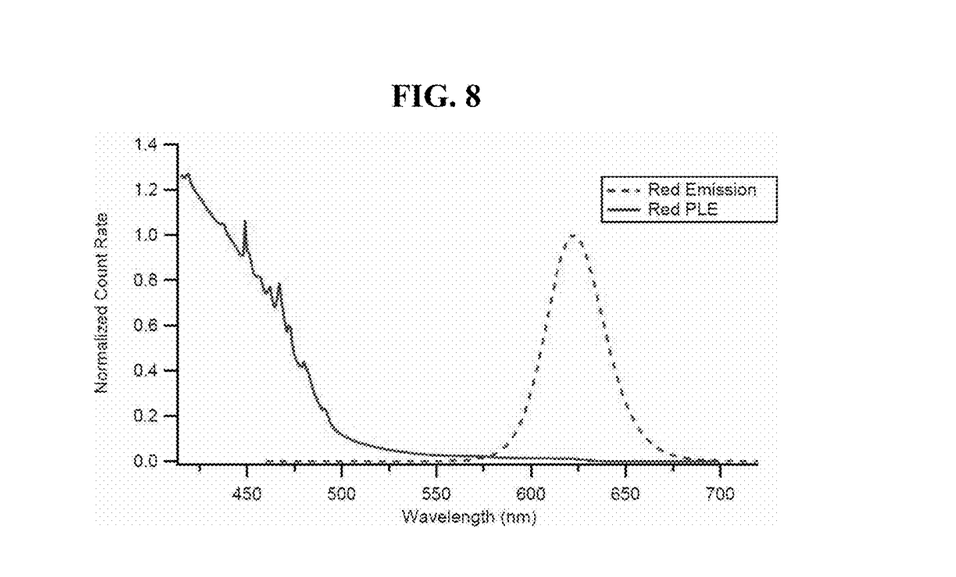
FIG. 8 is a graph depicting an excitation spectrum of quantum dots emitting red light according to an exemplary embodiment.

Referring to FIG. 7 depicting an excitation spectrum of red light phosphors, and FIG. 8 depicting an excitation spectrum of red light quantum dot phosphors, the phosphors 151 have a fluorescence intensity of 10 or less at a peak wavelength of green light (e.g., 515 nm to 530 nm) emitted from the green light emitting diode chip, with reference to a maximum fluorescence intensity of 100 (e.g., at around 470 nm) of the excitation spectrum of green light emitted from the green light emitting diode chip.

In addition, for the light emitting diode package according to the present exemplary embodiment, the color coordinates (CIE), light output (IV), and color gamut with reference to the NTSC (National Television System Committee) were measured, before and after formation of the wavelength conversion part including the phosphors, and measurement results are shown in Table 1 below.

Figure 9:
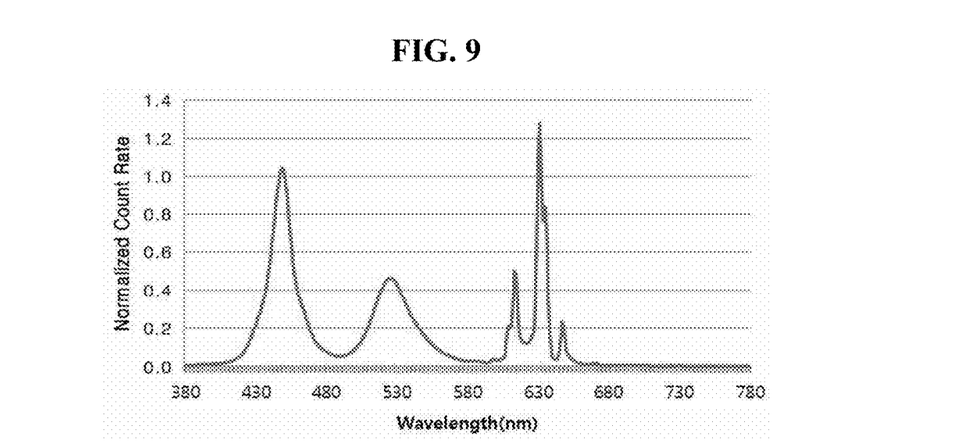
FIG. 9 is a luminous spectrum distribution of a light emitting diode package according to an exemplary embodiment.

As a comparative example, a conventional light emitting diode package was manufactured. The conventional light emitting diode package includes a blue light emitting diode chip and a wavelength conversion part including both green light phosphors and red light phosphors. For the conventional light emitting diode package, the color coordinates (CIE), light output (IV), and color gamut with reference to the NTSC (National Television System Committee) were measured, before and after formation of the wavelength conversion part including the phosphors. Measurement results are shown in Table 1 and a graph of the spectrum distribution thereof is shown in FIG. 9.

TABLE 1

| PKG | Chip | | Phosphors | Before formation of wavelength conversion part | | | | After formation of wavelength conversion part | | | | NTSC |
| --- | --- | --- | --- | --- | --- | --- | --- | --- | --- | --- | --- | --- |
| | Blue | Green | | CIE x | CIE y | IV | ΔIV(%) | CIE x | CIE y | IV | ΔIV(%) | |
| Comparative Example | Blue | | Green + Red | 0.258 | 0.236 | 24.7 | 100.0% | 0.269 | 0.282 | 1.84 | 100.0% | 93.2 |
| Example | Blue | Green | Red | 0.258 | 0.235 | 32.6 | 131.8% | 0.271 | 0.288 | 2.53 | 137.4% | 100.2 |

As shown in Table 1, it can be seen that the light emitting diode package according to an exemplary embodiment emits white light in desired color coordinates and has greater light output than the conventional light emitting diode package by 30% or more. Accordingly, the light emitting diode package according to the exemplary embodiment emits brighter light than the conventional light emitting diode package under the same power conditions and improves economic feasibility and durability through reduction in power consumption.

In addition, as measured with reference to the NTSC (National Television System Committee), the conventional light emitting diode package had a color gamut of 93.2%, whereas the light emitting diode package according to the exemplary embodiment had a color gamut of 100.2%, thereby achieving significant improvement in resolution.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A light emitting diode package comprising:
   a housing;
   a first light emitting diode chip and a second light emitting diode chip disposed in the housing; and
   a wavelength conversion part comprising a phosphor configured to absorb light emitted from the first light emitting diode chip and emit light having a different wavelength than the light emitted from the first light emitting diode chip,
   wherein:
   the light emitted from the first light emitting diode chip has a shorter wavelength than light emitted from the second light emitting diode chip; and
   the phosphor has a fluorescence intensity of 10 or less at a peak wavelength of light emitted from the second light emitting diode chip, with reference to a maximum fluorescence intensity of 100 at a wavelength of 425 nm to 475 nm on an excitation spectrum of the second light emitting diode chip.

2. The light emitting diode package according to claim 1, wherein the first light emitting diode chip and the second light emitting diode chip are configured to emit blue light and green light, respectively.

3. The light emitting diode package according to claim 1, wherein the first light emitting diode chip is configured to emit blue light, the second light emitting diode chip is configured to emit green light, and the wavelength conversion part is configured to emit red light.

4. The light emitting diode package according to claim 3, wherein:
   the blue light has a peak wavelength of 440 nm to 460 nm; and
   the green light has a peak wavelength of 515 nm to 530 nm.

5. The light emitting diode package according to claim 3, wherein the phosphor comprises at least one of nitride phosphor, sulfide phosphor, fluoride phosphor, quantum dot phosphor, and combinations thereof.

6. The light emitting diode package according to claim 3, wherein:
   the phosphor comprises fluorine-based phosphor; and
   the phosphor has a fluorescence intensity of 5 or less at the peak wavelength of the light emitted from the second light emitting diode chip, with reference to the maximum fluorescence intensity of 100 on the excitation spectrum thereof.

7. The light emitting diode package according to claim 3, wherein the phosphor is a quantum dot phosphor and comprises at least one compound semiconductor of In, Zn, S, Cd, Se, Pb, and combinations thereof.

8. The light emitting diode package according to claim 3, wherein red light emitted from the wavelength conversion part exhibits at least three peaks at a wavelength of 600 nm to 660 nm.

9. The light emitting diode package according to claim 1, wherein the light emitting diode package is configured to emit white light by mixing light emitted from the first light emitting diode chip, the second light emitting diode chip, and the wavelength conversion part.

10. The light emitting diode package according to claim 9, wherein the light emitting diode package has a color gamut of 95% or more with reference to an NTSC (National Television System Committee).

11. A light emitting diode module comprising a light emitting diode package, the light emitting diode package comprises:
    a housing;
    a first light emitting diode chip and a second light emitting diode chip disposed in the housing; and
    a wavelength conversion part comprising a phosphor configured to absorb light emitted from the first light emitting diode chip and emit light having a different wavelength than the light emitted from the first light emitting diode chip,
    wherein:
    the light emitted from the first light emitting diode chip has a shorter wavelength than light emitted from the second light emitting diode chip; and
    the phosphor has a fluorescence intensity of 10 or less at a peak wavelength of light emitted from the second light emitting diode chip, with reference to a maximum fluorescence intensity of 100 at a wavelength of 425 nm to 475 nm on an excitation spectrum of the second light emitting diode chip.

12. A light emitting diode package comprising:
    a housing comprising a first cavity and a second cavity;
    a first light emitting diode chip disposed in the first cavity;
    a second light emitting diode chip disposed in the second cavity; and
    a wavelength conversion part disposed in the first cavity and configured to convert wavelengths of light emitted from the first light emitting diode chip,
    wherein:
    light emitted from the second light emitting diode chip has a shorter wavelength than light emitted from the wavelength conversion part; and
    the light emitted from the second light emitting diode chip is configured to be blocked from entering the wavelength conversion part.

13. The light emitting diode package according to claim 12, wherein:
    the wavelength conversion part further comprises a first transparent resin comprising phosphors dispersed therein; and
    the second cavity comprises a second transparent resin not comprising phosphors.

14. The light emitting diode package according to claim 12, wherein the first light emitting diode chip and the second light emitting diode chip are configured to emit blue light and green light, respectively.

15. The light emitting diode package according to claim 12, wherein the first light emitting diode chip is configured to emit blue light, the second light emitting diode chip is configured to emit green light, and the wavelength conversion part is configured to emit red light.

16. The light emitting diode package according to claim 15, wherein:
   the blue light has a peak wavelength of 440 nm to 460 nm; and
   the green light has a peak wavelength of 515 nm to 530 nm.

17. The light emitting diode package according to claim 15, wherein the phosphors comprise at least one of nitride phosphors, sulfide phosphors, fluoride phosphors, quantum dot phosphors, and combinations thereof.

18. The light emitting diode package according to claim 15, wherein:
   the phosphors comprise fluorine-based phosphors; and
   the phosphors have a fluorescence intensity of 5 or less at the peak wavelength of the light emitted from the second light emitting diode chip, with reference to a maximum fluorescence intensity of 100 on an excitation spectrum thereof.

19. The light emitting diode package according to claim 15, wherein the phosphors are quantum dot phosphors and comprise at least one compound semiconductor of In, Zn, S, Cd, Se, Pb, and combinations thereof.

20. The light emitting diode package according to claim 15, wherein red light emitted from the wavelength conversion part exhibits at least three peaks at a wavelength of 600 nm to 660 nm.

* * * * *